United States Patent
Morimoto

(10) Patent No.: US 9,660,511 B2
(45) Date of Patent: May 23, 2017

(54) GATE DRIVER CIRCUIT AND POWER CONVERSION APPARATUS USING SAME

(71) Applicant: Panasonic Intellectual Property Management Co., Ltd., Osaka (JP)

(72) Inventor: Atsushi Morimoto, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/023,417

(22) PCT Filed: Oct. 30, 2014

(86) PCT No.: PCT/JP2014/005481
§ 371 (c)(1),
(2) Date: Mar. 21, 2016

(87) PCT Pub. No.: WO2015/072098
PCT Pub. Date: May 21, 2015

(65) Prior Publication Data
US 2016/0218612 A1    Jul. 28, 2016

(30) Foreign Application Priority Data
Nov. 13, 2013 (JP) ................................ 2013-234955

(51) Int. Cl.
*H02M 1/08* (2006.01)
*H02M 7/5387* (2007.01)
(Continued)

(52) U.S. Cl.
CPC ........... *H02M 1/08* (2013.01); *H02M 7/5387* (2013.01); *H03K 3/012* (2013.01);
(Continued)

(58) Field of Classification Search
CPC .. H02M 3/33569; H02M 3/28; H03K 17/162; H03K 17/691; Y02B 70/1475
(Continued)

(56) References Cited

U.S. PATENT DOCUMENTS 5,055,722 A * 10/1991 Latos .................... H03K 17/567
327/379
5,481,219 A * 1/1996 Jacobs ............. H03K 17/04123
327/377
(Continued)

FOREIGN PATENT DOCUMENTS

JP    11-308084    11/1999
JP    2008-182381    8/2008
(Continued)

OTHER PUBLICATIONS

International Search Report of PCT application No. PCT/JP2014/005481 dated Jan. 13, 2015.

*Primary Examiner* — Rajnikant Patel
(74) *Attorney, Agent, or Firm* — McDermott Will & Emery LLP

(57) ABSTRACT

A gate driver circuit capable of quickly driving a semiconductor device without erroneous ignitions. It has a positive power supply for forward bias, a negative power supply for backward bias, a first bias circuit that outputs the positive- or negative-power-supply voltage according to gate driver signal S, a capacitor that is charged by the negative-power-supply voltage when the first bias circuit outputs the negative-power-supply voltage, and a second bias circuit that supplies the gate of the semiconductor device with the positive- or negative-power-supply voltage according to gate driver signal S. Only in an early stage of a transition period during which the semiconductor device is turned on, the second bias circuit supplies the gate of the semiconductor device, instead of the positive-power-supply voltage, (Continued)

with a voltage boosted by adding the charged voltage of the capacitor onto the positive-power-supply voltage outputted from the first bias circuit.

6 Claims, 6 Drawing Sheets

(51) Int. Cl.
*H03K 17/0412* (2006.01)
*H03K 3/012* (2006.01)
*H03K 17/687* (2006.01)

(52) U.S. Cl.
CPC ..... *H03K 17/04123* (2013.01); *H03K 17/687* (2013.01); *H03K 2217/0045* (2013.01); *H03K 2217/0081* (2013.01)

(58) Field of Classification Search
USPC .......... 363/16–20, 21.02, 21.12, 21.14, 56.1, 363/56.12, 89, 97, 131; 327/374, 382, 327/389, 427, 434
See application file for complete search history.

(56) References Cited

U.S. PATENT DOCUMENTS

| 5,708,571 | A | * | 1/1998 | Shinada | ............ | H02M 3/33592 |
| | | | | | | 363/16 |
| 5,745,353 | A | * | 4/1998 | Sato | ........................ | H02M 1/34 |
| | | | | | | 363/131 |
| 6,038,143 | A | * | 3/2000 | Miyazaki | ............ | H02M 3/3385 |
| | | | | | | 363/19 |

FOREIGN PATENT DOCUMENTS

| JP | 2009-200891 | 9/2009 |
| JP | 2010-200560 | 9/2010 |
| JP | 2013-099181 | 5/2013 |

* cited by examiner

GATE DRIVER CIRCUIT AND POWER
CONVERSION APPARATUS USING SAME

TECHNICAL FIELD

The present disclosure relates to a gate driver circuit for quickly driving a semiconductor device without erroneous ignitions, and also relates to a power conversion apparatus using the gate driver circuit.

BACKGROUND ART

For example, a conventional gate driver circuit is structured as follows. A capacitor is charged in advance by a dedicated power supply. In an initial stage of a transition period during which the semiconductor device as a switching element is turned on, a drive voltage is generated by boosting a drive power supply voltage based on the charged voltage of the capacitor. The generated drive voltage is supplied to the semiconductor device. In such a structure, a variable voltage generating section controls the charged voltage of the capacitor according to an instruction signal, by which the drive voltage is appropriately controlled and is used for high-speed switching of the semiconductor device. Further, the electric charge stored in the capacitor has been discharged by the end of the Miller period that has change in the drain-source voltage of a MOSFET (metal-oxide-semiconductor field-effect transistor) as a switching element (see Patent literature 1).

The following is another example of a conventional gate driver circuit. The capacitor is charged during the semiconductor device remains off. When the semiconductor device is turned on, the input capacitance of the semiconductor device undergoes initial charge quickly by forward-direction high voltage as an in-series combined voltage of the power source voltage and the charged voltage of the capacitor, so that the semiconductor device turns on quickly (see Patent literature 2).

CITATION LIST

Patent Literature

PTL 1: Japanese Unexamined Patent Application Publication No. 2013-99181
PTL 2: Japanese Unexamined Patent Application Publication No. 2010-200560

SUMMARY OF THE INVENTION

The present disclosure provides a gate driver circuit for quickly driving a semiconductor device without erroneous ignitions.

The gate driver circuit of the present disclosure, which is a gate driver circuit for driving a gate of a semiconductor device, has a positive power supply for forward bias of the semiconductor device, a negative power supply for backward bias of the semiconductor device, a first bias circuit, a capacitor, and a second bias circuit. The first bias circuit receives a gate driver signal and outputs the voltage of the positive or the negative power supply according to the gate driver signal. The capacitor is charged by the voltage of the negative power supply when the first bias circuit outputs the voltage of the negative power supply. The second bias circuit receives a gate driver signal and supplies a gate of the semiconductor device with the voltage of the positive or the negative power supply according to the gate driver signal.

Further, in an early stage of a transition period during which the semiconductor device is turned on, the second bias circuit supplies the gate of the semiconductor device, instead of the voltage of the positive power supply, with a voltage boosted by adding the charged voltage of the capacitor onto the voltage of the positive power supply outputted from the first bias circuit.

With the structure above, the semiconductor device is driven on a voltage boosted by adding the negative-power-supply voltage onto the positive-power-supply voltage in an early stage at turn-on, and after the electric charge stored in the capacitor has been discharged, the semiconductor device is driven on the positive-power-supply voltage.

The capacitor should accumulate electric charge of not more than the amount necessary for the gate voltage of the semiconductor device to reach the plateau voltage at turn-on of the semiconductor device.

According to the gate driver circuit of the present disclosure, the capacitor is charged by the voltage of the negative power supply, i.e., the backward-bias voltage. This allows the forward-bias voltage at turn-on to have a stepwise change by the gate driver signal alone. The structure of the present disclosure provides the gate driver circuit capable of high-speed driving with a cost-reduced simple structure. Besides, the forward-bias voltage is not excessively high voltage (for example, twice as much as the voltage of the positive power supply), but is determined by adding the backward-bias voltage thereon. The structure eliminates a surge of the gate current, suppresses a current peak, and determines an appropriate current-peak time.

Further, when the capacitor accumulates electric charge of not more than the amount necessary for the gate voltage of the semiconductor device to reach the plateau voltage at turn-on of the semiconductor device, the semiconductor device can be driven on the positive-power-supply voltage alone after the Miller period. As a result, the structure suppresses a peak value of charging current for Miller capacitance, with no decrease in changing period of device terminal voltage of the opposing arms of a bridge structure; accordingly, suppresses erroneous ignitions.

DESCRIPTION OF EMBODIMENT

Prior to describing the exemplary embodiment of the present disclosure, problems in a conventional gate driver circuit will be described briefly. In the structure of the gate driver circuit shown in Patent literature 1 where the variable-voltage generating section controls voltage change, when the semiconductor device is driven at a high speed of tens of nanoseconds or less, the voltage has to be changed not only in synchronization with an instruction signal and a PWM (pulse-width modulation) signal, but also based on the instruction signal. That is, the structure has poor responsivity in structuring a control system. Besides, the need for additionally forming the variable-voltage generating section makes the circuit structure complex and increases the production cost.

Further, when the discharging period of the accumulated electric charge contains the Miller period, the changing period of the drain-source voltage of the opposing arms in the semiconductor device of a bridge structure becomes shorter. This increases the peak value of charging current for the Miller capacitance, resulting in increase in possibility of erroneous ignitions of the semiconductor device being in the off state.

Further, according to the gate driver circuit shown in Patent literature 2, the semiconductor device is turned on quickly such that the gate input capacitance of the semiconductor device undergoes quick initial charge by a voltage twice as much as the voltage of the power supply. If the device to be driven is a compound semiconductor (for example, SiC, GaN) with a large gate capacitance, the peak of gate current becomes excessively large; accordingly, the current capacitance of the semiconductor device that carries gate current becomes large. As a result, the gate driver circuit needs to have an increased board space, and accordingly, the inductance of wiring on the printed circuit board increases. This easily invites superimposition of high-frequency noise and increases the possibility of erroneous ignitions caused by self-generated noise.

Hereinafter, the exemplary embodiment of the present disclosure will be described with reference to accompanying drawings.

Figure 1:
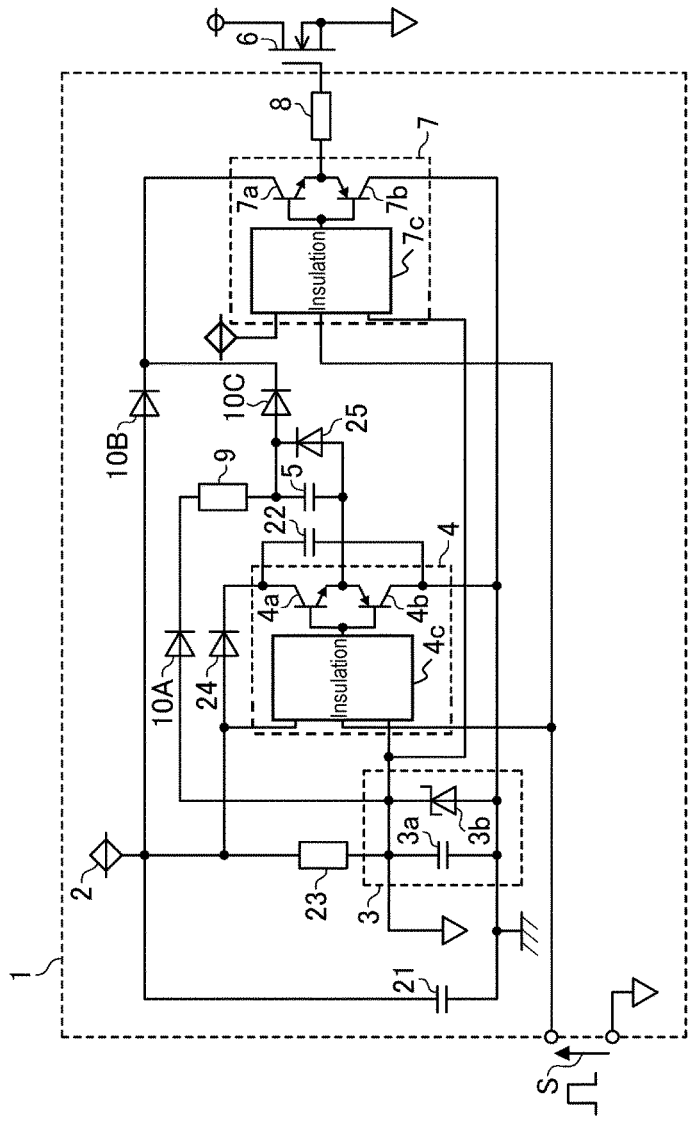
FIG. 1 is a circuit diagram showing a structure of the gate driver circuit in accordance with an exemplary embodiment of the present disclosure.

FIG. 1 is a circuit diagram showing the structure of the gate driver circuit in accordance with the exemplary embodiment of the present disclosure. Gate driver circuit 1 of FIG. 1 is the circuit for driving the gate of semiconductor device 6 formed of a MOSFET. Gate driver circuit 1 has positive power supply 2, negative power supply 3, first bias circuit 4, capacitor 5, second bias circuit 7, limiting resistors 8, 9, back-flow prevention diodes 10A, 10B, 10C, capacitor 21, 22, resistor 23, and back-flow prevention diodes 24, 25.

Positive power supply 2 is the power supply for forward bias of semiconductor device 6. Negative power supply 3, which is the power supply for backward bias of semiconductor device 6, is formed of capacitor 3a and zener diode 3b connected in parallel. Capacitor 21 and resistor 23 are disposed between positive power supply 2 and negative power supply 3.

First bias circuit 4 is formed of NPN transistor 4a, PNP transistor 4b, and insulation circuit 4c. Receiving gate driver signal S (that is also a PWM signal), first bias circuit 4 outputs the voltage of positive power supply 2 or negative power supply 3 according to gate driver signal S. Specifically, when NPN transistor 4a gets into the on state in response to gate driver signal S, first bias circuit 4 outputs the voltage of positive power supply 2 via back-flow prevention diode 24 and NPN transistor 4a. When PNP transistor 4b gets into the on state in response to gate driver signal S, first bias circuit 4 outputs the voltage of negative power supply 3 via PNP transistor 4b.

When first bias circuit 4 outputs the voltage of negative power supply 3, capacitor 5 is charged by the voltage of negative power supply 3. Limiting resistor 9 limits charging current to capacitor 5. Back-flow prevention diode 10A prevents discharging current from capacitor 5 so as not to flow toward negative power supply 3.

Second bias circuit 7 is formed of NPN transistor 7a, PNP transistor 7b, and insulation circuit 7c. Receiving gate driver signal S, second bias circuit 7 supplies the gate of semiconductor device 6 with the voltage of positive power supply 2 or negative power supply 3 according to gate driver signal S. However, only in an early stage of the transition period during which semiconductor device 6 is turned on, second bias circuit 7 supplies the gate of semiconductor device 6 with, instead of the voltage of positive power supply 2, a voltage boosted by adding the charged voltage in capacitor 5 onto the voltage of positive power supply 2 outputted from first bias circuit 4. Back-flow prevention diode 10B prevents discharging current from capacitor 5 so as not to flow toward positive power supply 2, whereas back-flow prevention diode 10C prevents charging current from positive power supply 2 so as not to flow toward capacitor 5. Limiting resistor 8 limits driving current for semiconductor device 6.

Figure 2:
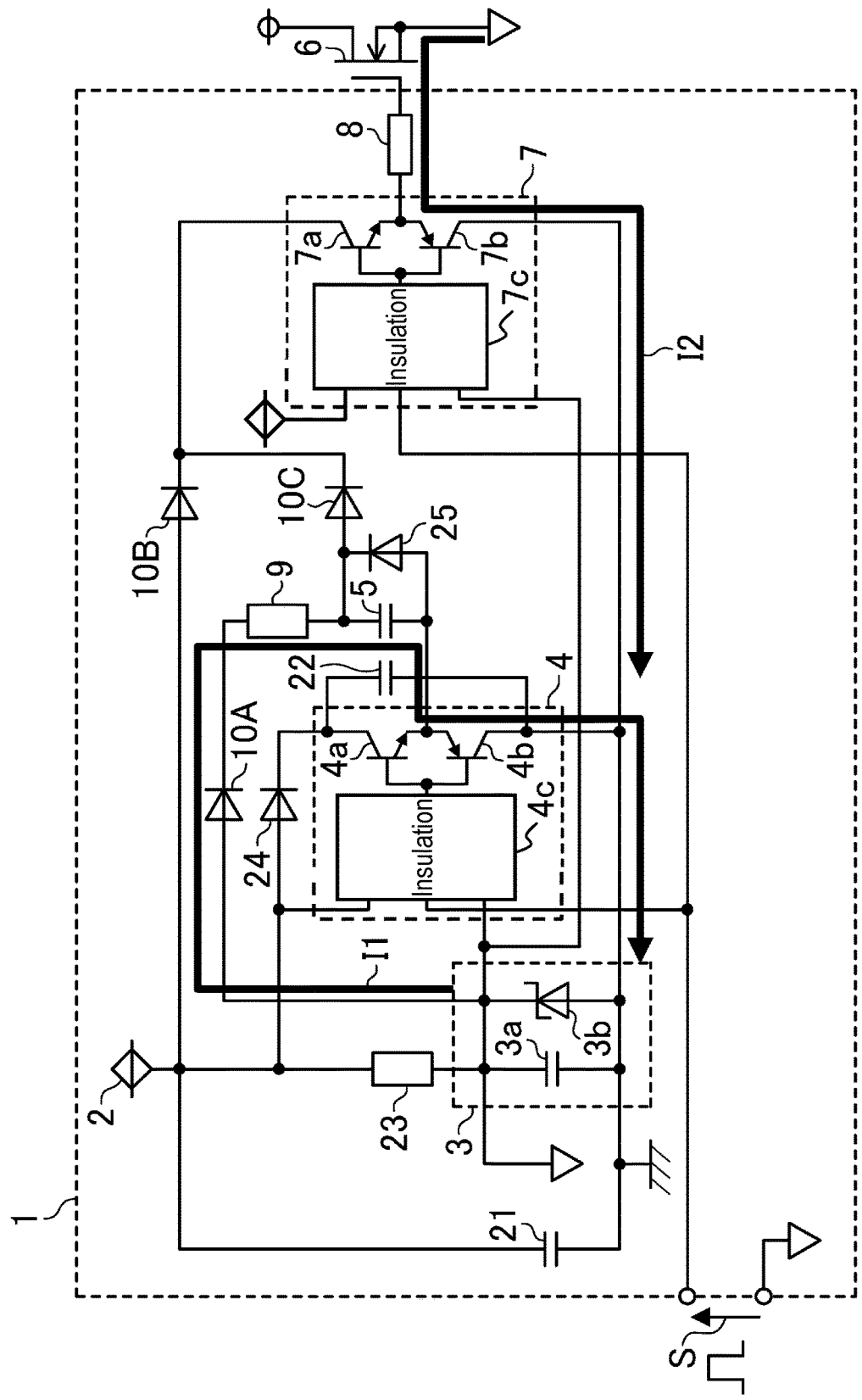
FIG. 2 shows the workings of the gate driver circuit of FIG. 1 in response to the gate driver signal indicating L level.

FIG. 2 illustrates the workings of gate driver circuit 1 of FIG. 1 in a state where gate driver signal S indicates L level, and PNP transistor 4b of first bias circuit 4 and PNP transistor 7b of second bias circuit 7 are in the on state. Under the state, negative power supply 3, back-flow prevention diode 10A, limiting resistor 9, capacitor 5, and PNP transistor 4b form a first closed loop, through which current I1 flows to charge capacitor 5. Electric charge is accumulated in capacitor 5; at that time, the positive pole is on the side of cathode of back-flow prevention diode 25 and the negative pole is on the side of anode of back-flow prevention diode 25. Further, second bias circuit 7 forms another closed loop via limiting resistor 8, through which current I2 flows, so that semiconductor device 6 gets into the off state.

Figure 3:
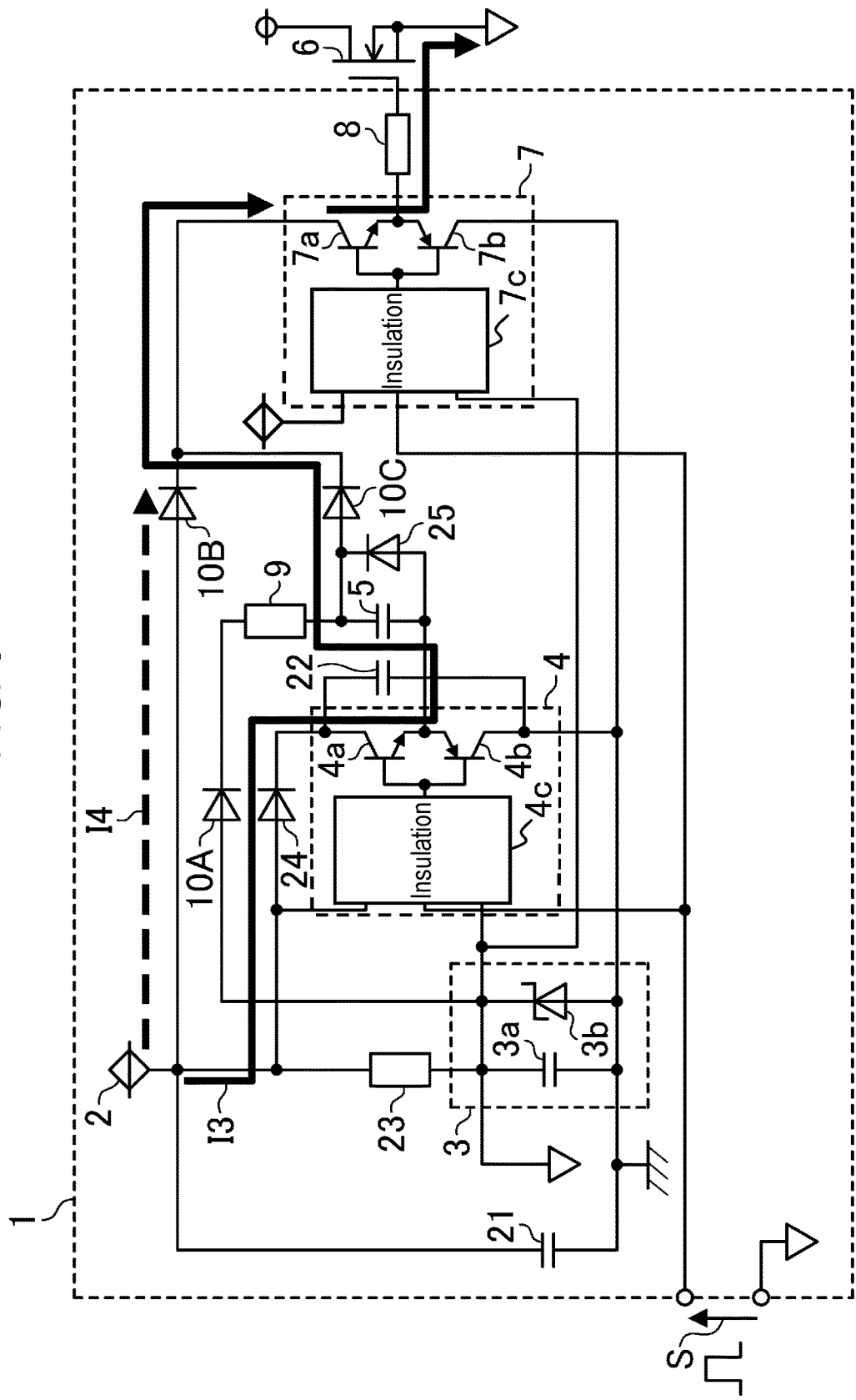
FIG. 3 shows the workings of the gate driver circuit of FIG. 1 in response to the gate driver signal indicating H level.

FIG. 3 illustrates the workings of gate driver circuit 1 of FIG. 1 in a state where gate driver signal S indicates H level, and NPN transistor 4a of first bias circuit 4 and NPN transistor 7a of second bias circuit 7 are in the on state. Under the state, current I3, which is fed from positive power supply 2, flows through NPN transistor 4a, capacitor 5, and back-flow prevention diode 10C, by which positive bias voltage is supplied from first bias circuit 4 to second bias circuit 7. At that time, the charged voltage in capacitor 5 is added onto the voltage of positive power supply 2 since the cathode side of back-flow prevention diode 25 is the positive pole, so that a boosted voltage is supplied, via NPN transistor 7a and limiting resistor 8, to the gate of semiconductor device 6. As the electric charge accumulated in capacitor 5 is gradually discharged, the charged voltage of capacitor 5 decreases with discharging. When the voltage at the connecting point between two back-flow prevention diodes 10B, 10C on the cathode side becomes lower than the voltage calculated by subtracting a decreased amount of voltage of back-flow prevention diode 10B from the voltage of positive power supply 2, no longer current I3 flows thorough capacitor 5; instead, current I4 fed from positive power supply 2 flows through back-flow prevention diode 10B.

As is described above, according to gate driver circuit 1 of FIG. 1, semiconductor device 6 is driven on the voltage boosted by adding the voltage of negative power supply 3 onto the voltage of positive power supply 2 in an early stage of the transition period during which semiconductor device 6 is turned on, and after that, it is driven on the voltage of positive power supply 2 alone. This allows the forward-bias voltage of semiconductor device 6 at turn-on to have a stepwise change by gate driver signal S alone. Therefore, semiconductor device 6 can be driven at high speed with a cost-reduced simple structure. Besides, the forward-bias voltage is appropriately determined so as not to be at an excessive level (for example, twice as much as the positive-power-supply voltage).

Figure 4:
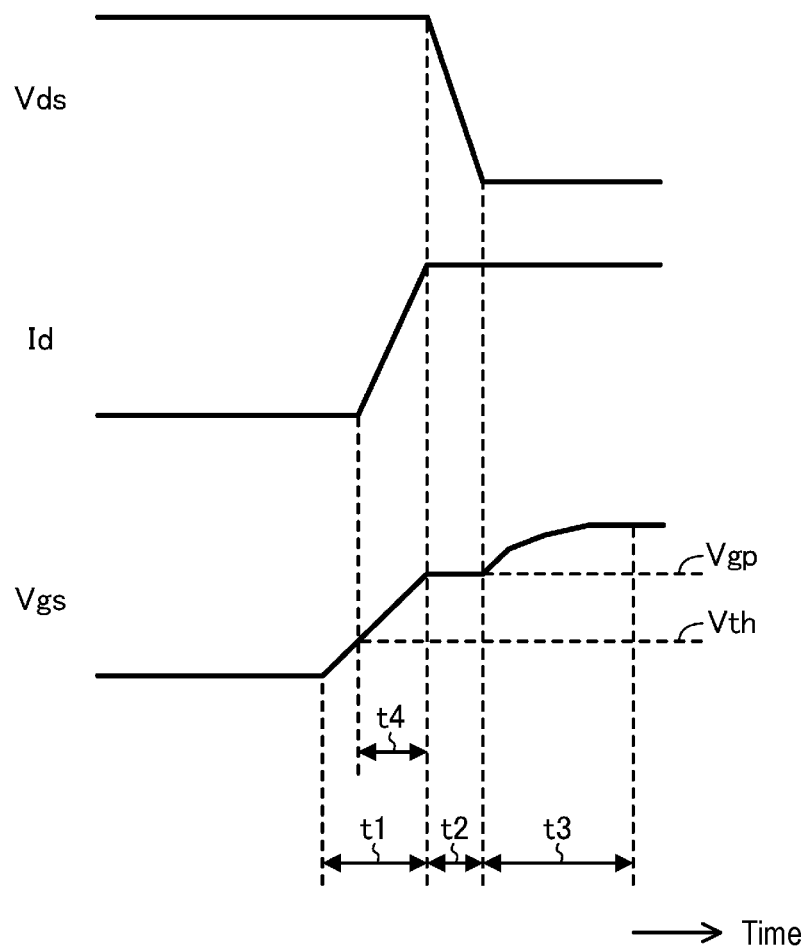
FIG. 4 shows an example of each waveform of a turned-on MOSFET when an inductive load is connected.

FIG. 4 shows an example of each waveform of a turned-on MOSFET when an inductive load is connected. FIG. 4 shows, from the top, drain-source voltage Vds, drain current Id, and gate-source voltage Vgs. In the graph, t1 represents the rising-edge period of gate-source voltage Vgs, t2 represents the Miller period during which gate-source voltage Vgs maintains at a constant level (i.e. at plateau voltage Vgp), t3 represents the increasing period of gate-source voltage Vgs after the Miller period, and t4 represents the rising-edge period of drain current Id. Rising-edge period t4 of drain current Id is included in rising-edge period t1 of gate-source voltage Vgs.

As shown in FIG. 4, when gate-source voltage Vgs exceeds threshold voltage Vth, drain current Id starts to flow. When gate-source voltage Vgs has reached plateau voltage Vgp, the MOSFET feeds predetermined load current. In the Miller period, drain-source voltage Vds decreases to a voltage determined by on-resistance and load current of the MOSFET. Shortening Miller period t2 and rising-edge period t4 of drain current is effective in reducing switching loss.

Figure 5:
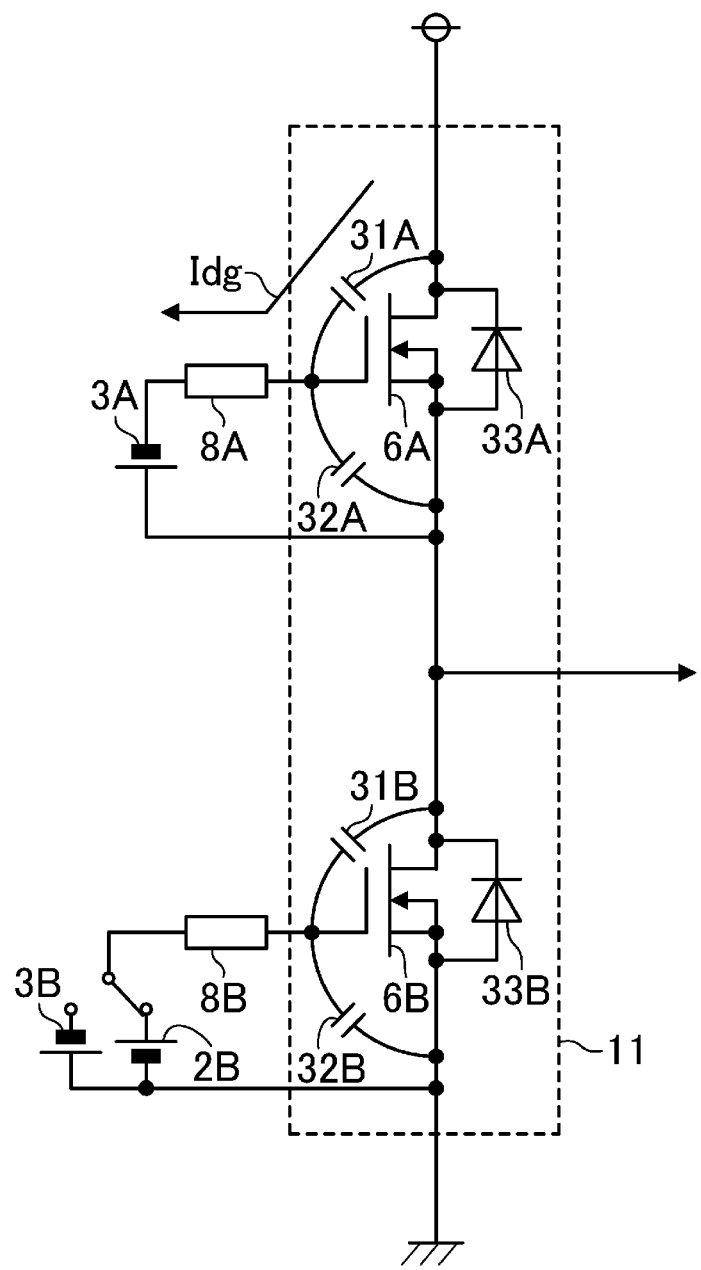
FIG. 5 is a circuit diagram illustrating the possibility of erroneous ignitions of a MOSFET in a half-bridge circuit having each arm formed of a MOSFET.

FIG. 5 is a circuit diagram illustrating the possibility of erroneous ignitions of a MOSFET in a half-bridge circuit having each arm formed of a MOSFET. Half-bridge circuit 11 of FIG. 5 has a series circuit formed of semiconductor device 6A as the upper-arm MOSFET and semiconductor device 6B as the lower-arm MOSFET. In semiconductor device 6A of one arm, semiconductor device 33A as a tidal diode is connected between the drain and the source, and negative power supply 3A is connected to the gate via limiting resistance 8A so as to turn off semiconductor device 6A. Reference mark 31A represents gate-drain parasitic capacitance (Miller capacitance), and reference mark 32A represents gate-source parasitic capacitance. In semiconductor device 6B of the other arm, semiconductor device 33B as a tidal diode is connected between the drain and the source, and positive power supply 2B or negative power supply 3B is connected to the gate via limiting resistance 8B so as to turn on or off semiconductor device 6B. Reference mark 31B represents gate-drain parasitic capacitance, and reference mark 32B represents gate-source parasitic capacitance.

In FIG. 5, when semiconductor device 6B of the lower arm is switched from the off state into the on state, in the changing period of drain-source voltage Vds (corresponding to Miller period t2 of FIG. 4) of semiconductor device 6B, drain-gate voltage Vdg of semiconductor device 6A of the upper arm also changes, so that charging current Idg flows from the drain to the gate of semiconductor device 6A. The magnitude of charging current Idg depends on the changing speed of drain-gate voltage Vdg; the greater the changing speed of drain-gate voltage Vdg, the greater charging current Idg. Due to charging current Idg and the gate-source impedance of semiconductor device 6A, gate-source voltage Vgs of semiconductor device 6A—the voltage of negative power supply 3 applied to the gate as backward bias voltage—increases. This can trigger erroneous ignitions of semiconductor device 6A. In other words, to suppress the erroneous ignitions, Miller period t2 should not be shortened.

Considering above, instead of shortening Miller period t2, to shorten selectively rising-edge period t4 of drain current or rising-edge period t1 of gate-source voltage, capacitance C of capacitor 5 should be calculated by the expression below:

$C = Qp/V\text{minus}$, where, Qp represents the amount of gate-source electric charge until gate-source voltage Vgs of the MOSFET (i.e., semiconductor device 6 in FIG. 1) reaches plateau voltage Vgp, and Vminus represents the power-supply voltage of negative power supply 3.

That is, the electric charge accumulated in capacitor 5 should be determined to an amount smaller than the amount necessary for gate-source voltage Vgs to reach plateau voltage Vgp at the turn-on of semiconductor device 6. This allows the electric charge accumulated in capacitor 5 to have been discharged by the time at which Miller period t2 (FIG. 4) starts.

Instead of shortening Miller period t2, rising-edge period t4 of drain current or rising-edge period t1 of the gate-source voltage can be selectively shortened by employing capacitance C of capacitor 5 described above. This suppresses charging current Idg so as not to flow into parasitic capacitance (Miller capacitance) 31A of semiconductor device 6A in the structure of half-bridge circuit 11 where semiconductor device 6A in the off state is disposed opposite to turned-on semiconductor device 6B. As a result, erroneous ignitions of semiconductor device 6 can be suppressed.

Figure 6:
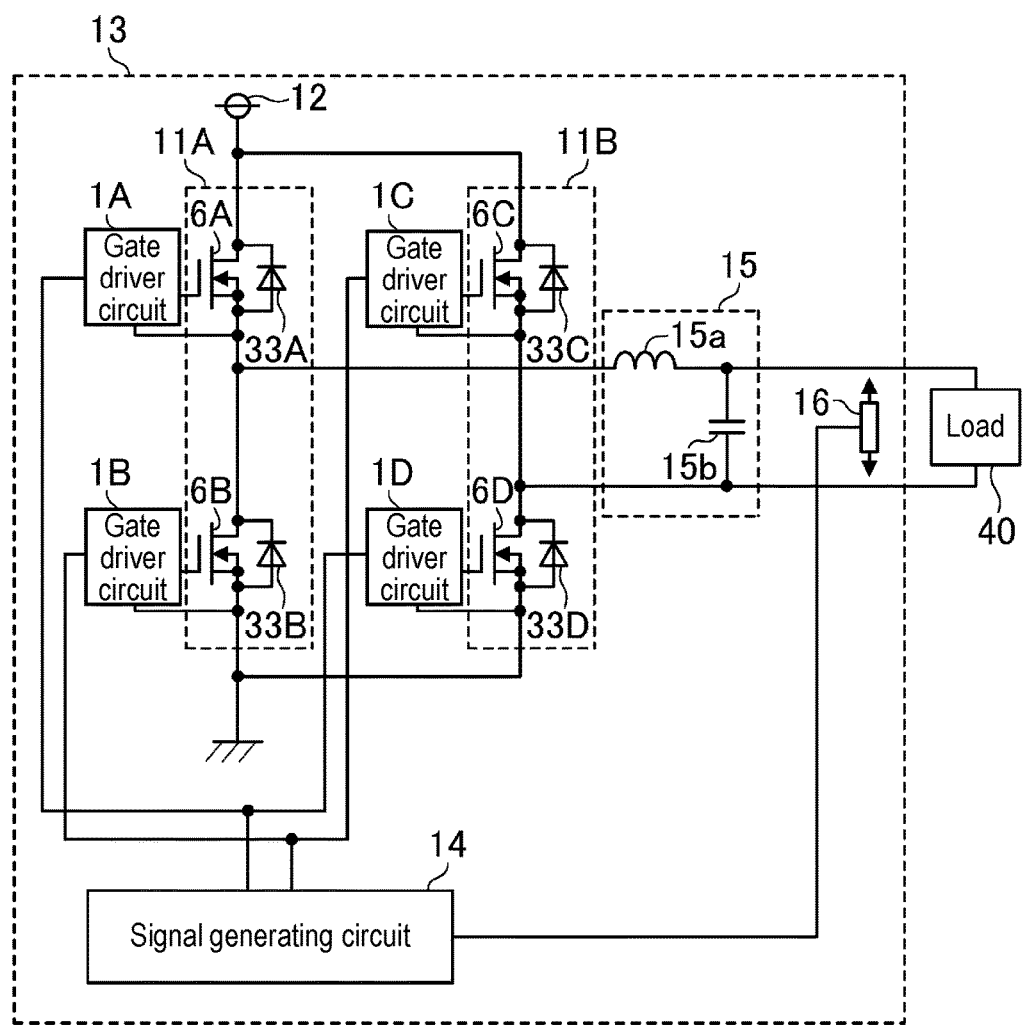
FIG. 6 is a circuit diagram showing a power conversion apparatus in which the gate driver circuit shown in FIG. 1 is employed for each arm of a full-bridge circuit.

FIG. 6 is a circuit diagram showing an example of a power conversion apparatus in which the gate driver circuit shown in FIG. 1 is employed for each arm of a full-bridge circuit. Power conversion apparatus 13 of FIG. 6 is a single-phase inverter having the following components: first and second half-bridge circuits 11A and 11B each of which is connected to DC power supply 12; signal generation circuit 14 for generating gate driver signals; filtering circuit 15 for shaping output waveforms; and voltage sensor 16 for detecting output voltage. Single-phase AC output is connected to load 40. Filtering circuit 15 is formed of inductor 15a and capacitor 15b.

First half-bridge circuit 11A has a series circuit formed of semiconductor device 6A as the upper-arm MOSFET and semiconductor device 6B as the lower-arm MOSFET. In semiconductor device 6A of one arm, semiconductor device 33A is connected between the drain and the source, and gate driver circuit 1A is connected between the gate and the source. In semiconductor device 6B of the other arm, semiconductor device 33B is connected between the drain and the source, and gate driver circuit 1B is connected between the gate and the source. Second half-bridge circuit 11B has a series circuit formed of semiconductor device 6C as the upper-arm MOSFET and semiconductor device 6D as the lower-arm MOSFET. In semiconductor device 6C of one arm, semiconductor device 33C as a tidal diode is connected between the drain and the source, and gate driver circuit 1C is connected between the gate and the source. In semiconductor device 6D of the other arm, semiconductor device 33D as a tidal diode is connected between the drain and the source, and gate driver circuit 1D is connected between the gate and the source. Each of gate driver circuits 1A, 1B, 1C, and 1D has a structure, for example, of FIG. 1.

Signal generating circuit 14 effects duty control based on PWM of each gate driver signal so that the gate driver signal is fed to each of gate driver circuits 1A, 1B, 1C, and 1D. Under the aforementioned control, when semiconductor device 33A of first half-bridge circuit 11A and semiconductor device 33D of second half-bridge circuit 11B are in the on state, semiconductor device 33B of first half-bridge circuit 11A and semiconductor device 33C of second half-bridge circuit 11B are kept in the off state. And, when semiconductor device 33C of second half-bridge circuit 11B and semiconductor device 33B of first half-bridge circuit 11A are in the on state, semiconductor device 33D of second half-bridge circuit 11B and semiconductor device 33A of first half-bridge circuit 11A are kept in the off state.

In power conversion apparatus 13 of FIG. 6, the output of voltage sensor 16 is fed back to signal generation circuit 14 so that the voltage, which is outputted from first and second half-bridge circuits 11A and 11B and to be applied to load 40 through filtering circuit 15, is formed into sinusoidal voltage having an intended peak value. Signal generating circuit 14 provides each gate driver signal with pulse width modulation.

As described above, in power conversion apparatus 13 of FIG. 6, the structure of gate driver circuit 1 of FIG. 1 is applied to each of gate driver circuits 1A, 1B, 1C, and 1D of FIG. 6. This contributes to low-loss operation, by which semiconductor devices 6A, 6B, 6C, and 6D are driven at high speed and prevents erroneous ignitions.

In the description above, MOSFETs are employed for semiconductor devices 6A, 6B, 6C, and 6D and shown in the drawings, the present disclosure is not limited to; employing an IGBT (insulated-gate bipolar transistor) for them also offers the similar effect.

Further, the semiconductor device is not limited to an Si-series power semiconductor device; it may be a compound semiconductor, for example, formed of SiC or GaN.

In the description, negative power supply 3 for backward bias is formed of capacitor 3a and zener diode 3b, but the present disclosure is not limited thereto and is applicable to other structures.

Although the present disclosure is described as the structure where insulation circuits 4c and 7c insulate between the control-signal side and the secondary side, it is not limited to; for example, a level-shift circuit may be employed.

Although power conversion apparatus 13 is described as a single-phase inverter in the description, it is not limited thereto; the present disclosure is also applicable to a power conversion apparatus of a three-phase inverter, a converter, or a matrix converter.

INDUSTRIAL APPLICABILITY

The gate driver circuit of the present disclosure performs two-step switching on the voltage to be applied to the gate of a power semiconductor device, offering high-speed driving and preventing erroneous ignition of the device. The present disclosure is useful to a driving technique of a semiconductor device employed for a power conversion apparatus that needs high-speed switching.

REFERENCE MARKS IN THE DRAWINGS 1, 1A, 1B, 1C, 1D gate driver circuit
2, 2B positive power supply
3, 3A, 3B negative power supply
3a capacitor
3b zener diode
4 first bias circuit
4a NPN transistor
4b PNP transistor
4c insulation circuit
5 capacitor
6, 6A, 6B, 6C, 6D semiconductor device
7 second bias circuit
7a NPN transistor
7b PNP transistor
7c insulation circuit
8, 8A, 8B limiting resistor
9 limiting resistor
10A, 10B, 10C back-flow prevention diode
11, 11A, 11B half-bridge circuit
12 DC power supply
13 power conversion apparatus
14 signal generating circuit
15 filtering circuit
15a inductor
15b capacitor
16 voltage sensor
21, 22 capacitor
23 resistor
24, 25 back-flow prevention diode
31A, 31B gate-drain parasitic capacitance
32A, 32B gate-source parasitic capacitance
33A, 33B, 33C, 33D semiconductor device
40 load
S gate driver signal

The invention claimed is:

1. A gate driver circuit for driving a gate of a semiconductor device, comprising:
   a positive power supply for forward bias of the semiconductor device;
   a negative power supply for backward bias of the semiconductor device;
   a first bias circuit that receives a gate driver signal and outputs a voltage of the positive or the negative power supply according to the gate driver signal;
   a capacitor that is charged by the voltage of the negative power supply when the first bias circuit outputs the voltage of the negative power supply; and
   a second bias circuit that receives the gate driver signal and supplies the gate of the semiconductor device with the voltage of the positive or the negative power supply according to the gate driver signal,
   wherein, in an early stage of a transition period during which the semiconductor device is turned on, the second bias circuit supplies the gate of the semiconductor device, instead of the voltage of the positive power supply, with a voltage boosted by adding voltage charged in the capacitor onto the voltage of the positive power supply outputted from the first bias circuit.

2. The gate driver circuit according to claim 1, wherein electric charge accumulated in the capacitor has not more than an amount necessary for a gate voltage of the semiconductor device to reach a plateau voltage at turn-on of the semiconductor device.

3. A power conversion apparatus employing the gate driver circuit of claim 1.

4. A gate driver circuit for driving a gate of a semiconductor device, comprising:
   a positive power supply;
   a negative power supply;
   a first bias circuit that receives a gate driver signal, a voltage of the positive power supply, and a voltage of the negative power supply, and outputs the voltage of the positive or the negative power supply according to the gate driver signal;
   a first capacitor that is charged by the voltage of the negative power supply when the first bias circuit outputs the voltage of the negative power supply;

a first resistor and a first back-flow prevention diode connected in series between the negative power supply and the first capacitor;

a second bias circuit that receives the gate driver signal and supplies the gate of the semiconductor device with the voltage of the positive or the negative power supply according to the gate driver signal;

a second resistor disposed between the positive power supply and the negative power supply;

a second back-flow prevention diode disposed between the positive power supply and the first bias circuit;

a third back-flow prevention diode connected in parallel with the first capacitor such that an anode side of the third back-flow prevention diode is connected to output of the first bias circuit;

a fourth back-flow prevention diode disposed between the positive power supply and the second bias circuit;

a fifth back-flow prevention diode whose anode side is connected to a cathode of the third back-flow prevention diode; and a third resistor connected to output of the second bias circuit.

5. The gate driver circuit according to claim 4, wherein,
the negative power supply is formed of a capacitor and a zener diode connected in parallel,
the first bias circuit is formed of a first insulation circuit, a first NPN transistor, and a first PNP transistor, and
the second bias circuit is formed of a second insulation circuit, a second NPN transistor, and a second PNP transistor.

6. A power conversion apparatus employing the gate driver circuit of claim 2.

* * * * *